United States Patent [19]
Yamazaki

[11] Patent Number: 5,438,222
[45] Date of Patent: Aug. 1, 1995

[54] ELECTRONIC DEVICE WITH PLURAL PAD CONNECTION OF SEMICONDUCTOR CHIP TO LEADS

[75] Inventor: Shunpei Yamazaki, Tokyo, Japan

[73] Assignee: Semiconductor Energy Laboratory Co., Ltd., Kanagawa, Japan

[21] Appl. No.: 28,606

[22] Filed: Mar. 8, 1993

Related U.S. Application Data

[63] Continuation of Ser. No. 571,264, Aug. 23, 1990, abandoned.

[30] Foreign Application Priority Data

Aug. 28, 1989 [JP] Japan ................... 1-221212
Aug. 28, 1989 [JP] Japan ................... 1-221213

[51] Int. Cl.⁶ .................... H01L 23/48; H01L 29/44
[52] U.S. Cl. ........................ 257/673; 257/737; 257/787; 257/790; 361/767; 361/808; 174/52.4
[58] Field of Search ............. 357/72, 70, 69, 54; 174/52.4; 257/673, 787, 790, 737, 738; 361/767, 808

[56] References Cited

U.S. PATENT DOCUMENTS

| | | | |
|---|---|---|---|
| 3,868,724 | 2/1975 | Perrino | 257/673 |
| 4,001,872 | 1/1977 | Khajezadeh | 357/54 |
| 4,024,570 | 5/1977 | Hartmann et al. | 357/81 |
| 4,707,724 | 11/1987 | Suzuki et al. | 357/71 |
| 4,814,295 | 3/1989 | Mehta | 361/808 |
| 4,912,545 | 3/1990 | Go | 257/737 |
| 4,974,057 | 11/1990 | Tazima | 557/72 |
| 5,057,900 | 10/1991 | Yamazaki | 357/70 |

FOREIGN PATENT DOCUMENTS

| | | | |
|---|---|---|---|
| 0140465 | 10/1979 | Japan | 257/737 |
| 0161664 | 12/1981 | Japan | 257/737 |
| 0021850 | 2/1983 | Japan | 357/72 |
| 0079348 | 4/1988 | Japan | 257/737 |
| 0103856 | 4/1989 | Japan | 257/673 |
| 0283855 | 11/1989 | Japan | 357/72 |
| 0106953 | 4/1990 | Japan | 357/72 |
| 0208948 | 8/1990 | Japan | 257/737 |
| 0237129 | 9/1990 | Japan | 257/737 |

*Primary Examiner*—Rolf Hille
*Assistant Examiner*—David Ostrowski
*Attorney, Agent, or Firm*—Sixbey, Friedman, Leedom & Ferguson; Gerald J. Ferguson, Jr.; David S. Safran

[57] ABSTRACT

A miniaturized electronic device and a manufacturing method for the same is disclosed. Solder is provided on pads provided on leads and corresponding pads provided on an electronic part chip of the electronic device are placed on the solder. The solder is radiated with infrared rays and thereby melted. Then connecting parts are completed. This electronic device does not have a die and wires for bonding. Therefore, it is more miniaturized than a conventional electronic device.

14 Claims, 4 Drawing Sheets

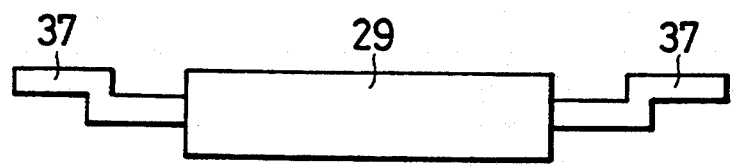
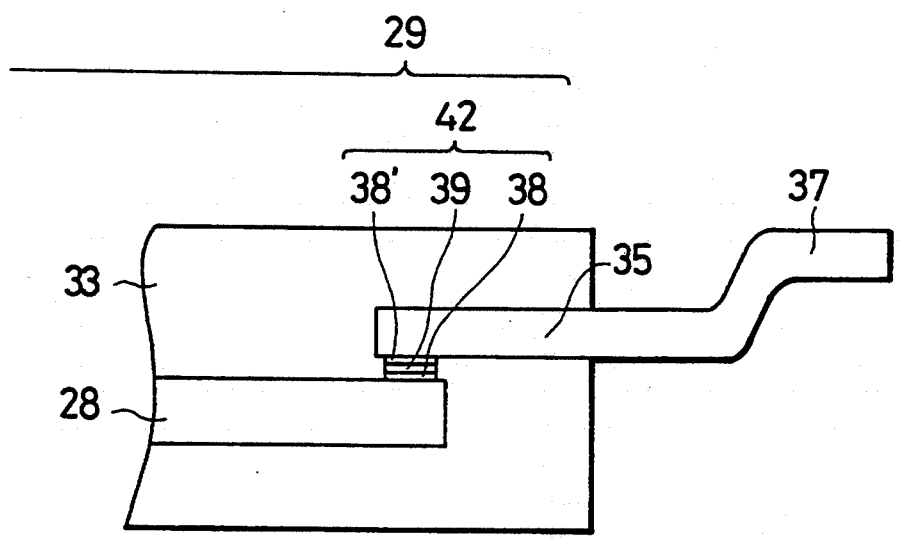
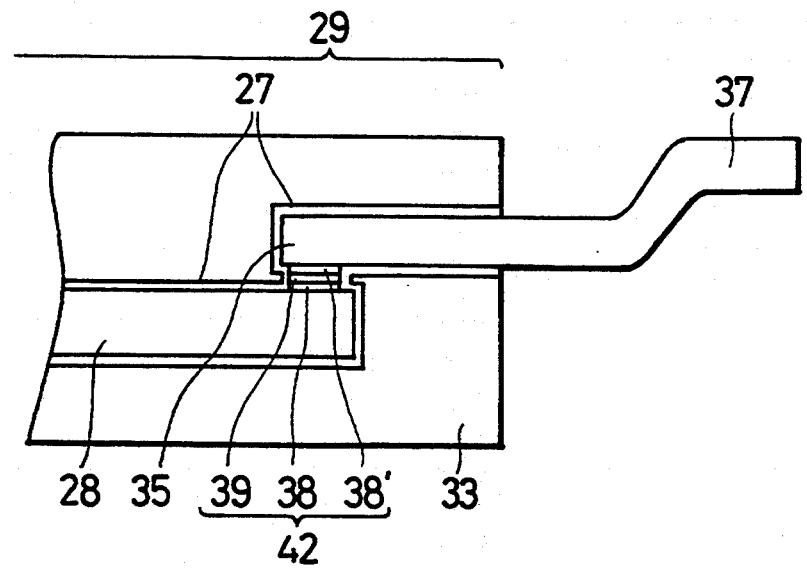

ELECTRONIC DEVICE WITH PLURAL PAD CONNECTION OF SEMICONDUCTOR CHIP TO LEADS

This application is a Continuation of Ser. No. 07/571,264, filed Aug. 23, 1990, now abandoned.

BACKGROUND OF THE INVENTION

1. Field of the Invention

The present invention relates to a more miniaturized electronic device such as a semiconductor device, and relates to a method for manufacturing such an electronic device.

2. Description of the Prior Art

Conventionally, an electronic device such as a semiconductor chip provided in computers or the like was connected by means of wire-bonding, for example. In the case of carrying out this wire-bonding, wires and a die had to be used in the electronic device.

SUMMARY OF THE INVENTION

It is an object of the present invention to provide a more miniaturized electronic device, and provide a method for manufacturing such an electronic device. The electronic device according to the present invention comprises an electronic part chip (which includes a semiconductor chip, for example, includes an integrated semiconductor device comprising a plurality of transistors), at least one lead, at least one connecting part to connect said chip with each of said at least one lead, and an organic resin layer, wherein each of at least one pad provided on said chip is connected to the corresponding pad provided on the lead by providing a conductive layer therebetween.

The electronic device of the present invention has the above composition, and there are no die or wires for bonding. So that, it is smaller than the conventional electronic devices.

BRIEF DESCRIPTION OF THE DRAWINGS

FIG. 2(A) is a cross sectional view of another electronic device of the present invention.

FIG. 2(B) and FIG. 2(C) are enlarged cross sectional views of one part in FIG. 2(A).

DETAILED DESCRIPTION OF THE PREFERRED EMBODIMENTS (Embodiment No.1)

Figure 1A:
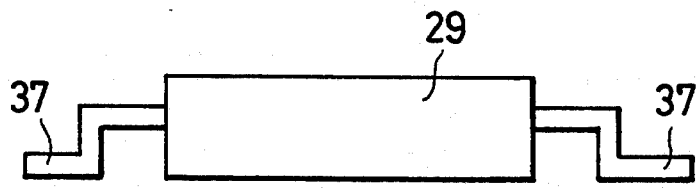
FIG. 1(A) is a cross sectional view of an electronic device of the present/invention.
Figure 1B:
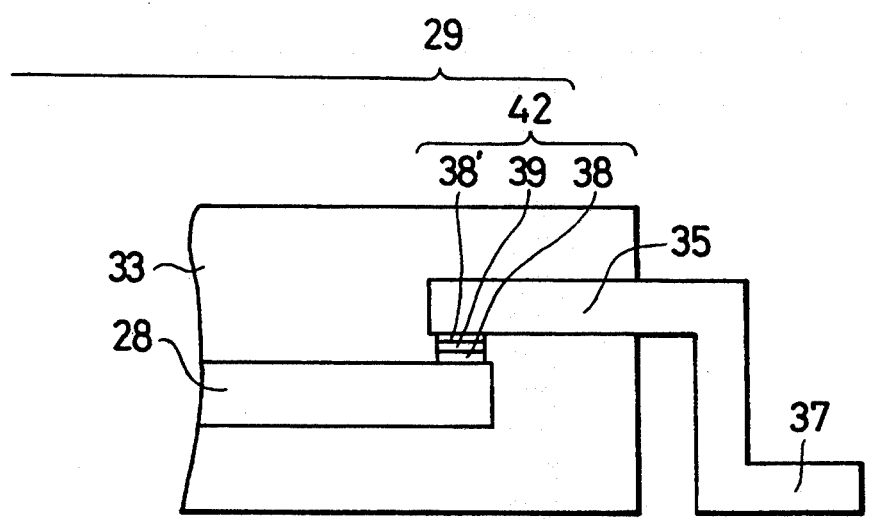
FIG. 1(B) and FIG. 1(C) are enlarged cross sectional views of one part in FIG. 1(A).

In FIG. 1(A) and FIG. 1(B) is shown an electronic device used in this embodiment. FIG. 1(B) is an enlarged view of one part in FIG. 1(A). Here is described an example of an electronic device having eighty terminals.

The electronic device comprises an electronic part chip 28, eighty leads 37 and stem portions 35 of said leads, eighty connecting parts 42, and an organic resin 33. Each of the connecting parts 42 is composed of a pad 38 provided on the chip 28, a pad 38' provided on the stem 35, and a conductive layer 39. A 42 alloy or a copper frame was used as the leads 37.

Each of the pads 38 was made of a metallic material. For example, each of the pads 38 was a multi-layer comprising an aluminum layer and a gold layer. A nickel-plated pad 38' was provided with a solder 39. The pad 38 and the pad 38' were aligned. The solder 39 was radiated with infrared rays and melted at about 260 degrees Centigrade and then cooled to complete one connecting part. Each of the eighty connecting parts was completed through the same process as described above.

One electronic device was completed by forming an epoxy resin 33 with a transfer mold method after the above process.

A plurality of the electronic devices can be manufactured at the same time, by using the same process of forming the connecting parts but mounting a plurality of the electronic part chips 28 on a single lead frame. In this case, after mounting the chips 28 on the single lead frame and forming the connecting parts, an epoxy resin is formed and then the single lead frame is severed into individual electronic devices.

(Embodiment No.2)

Figure 1C:
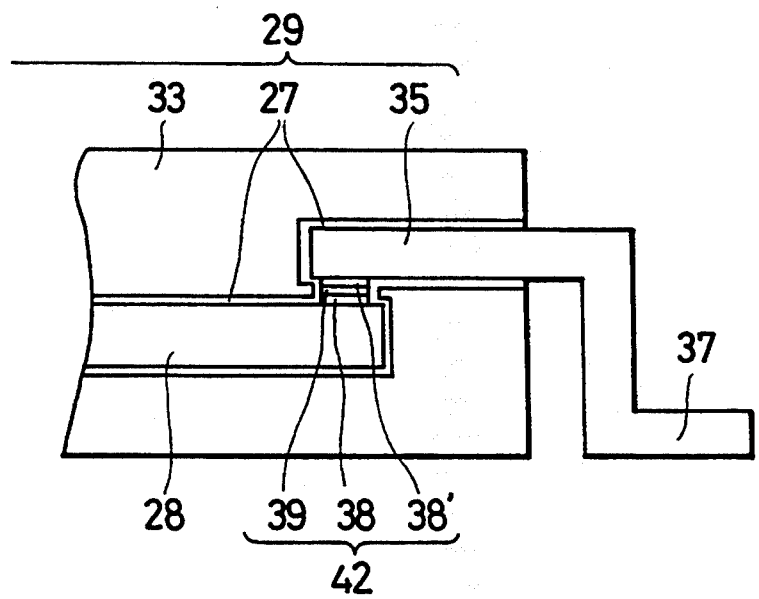
Figure 3:
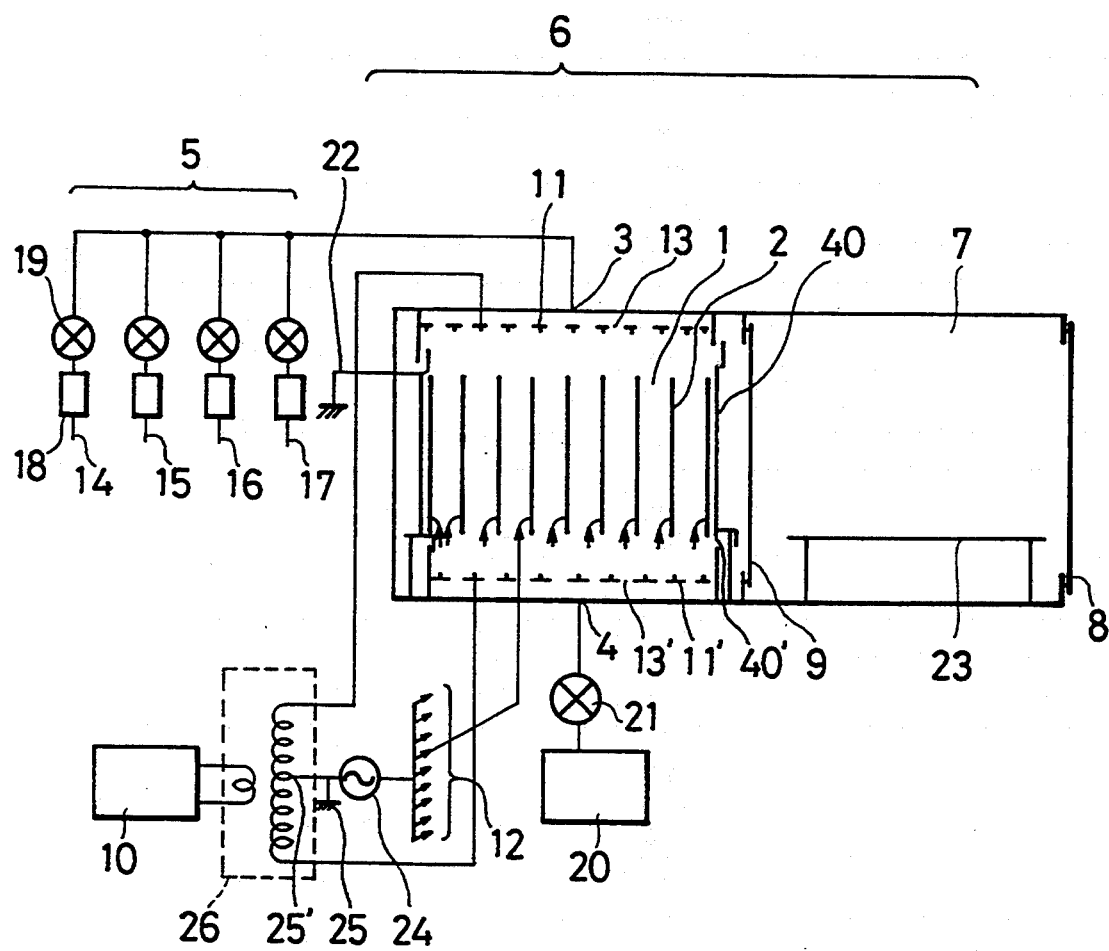
FIG. 3 is an outline of a plasma reaction apparatus to carry out a method of the present invention.

This embodiment shows an example to manufacture an electronic device having eighty terminals illustrated in FIG. 1(A) and FIG. 1(C), by means of a plasma reaction apparatus in FIG. 3. FIG. 1(C) is an enlarged view of one part in FIG. 1(A). A 42 alloy or a copper frame was used as leads 37.

In the same way as Embodiment No.1, a pad 38 provided on an electronic part chip 28 and a nickel-plated pad 38' provided on a stem 35 were connected by the steps of aligning the both pads and radiating solder 39 provided on the pad 38' with infrared rays to melt the solder at about 260 degrees Centigrade. Each of the eighty connecting parts was formed through the same process as described above. The pads 38 were made of a metallic material. For example, the pads 38 comprised an aluminum layer and a gold layer.

Figures 4A, 4B:
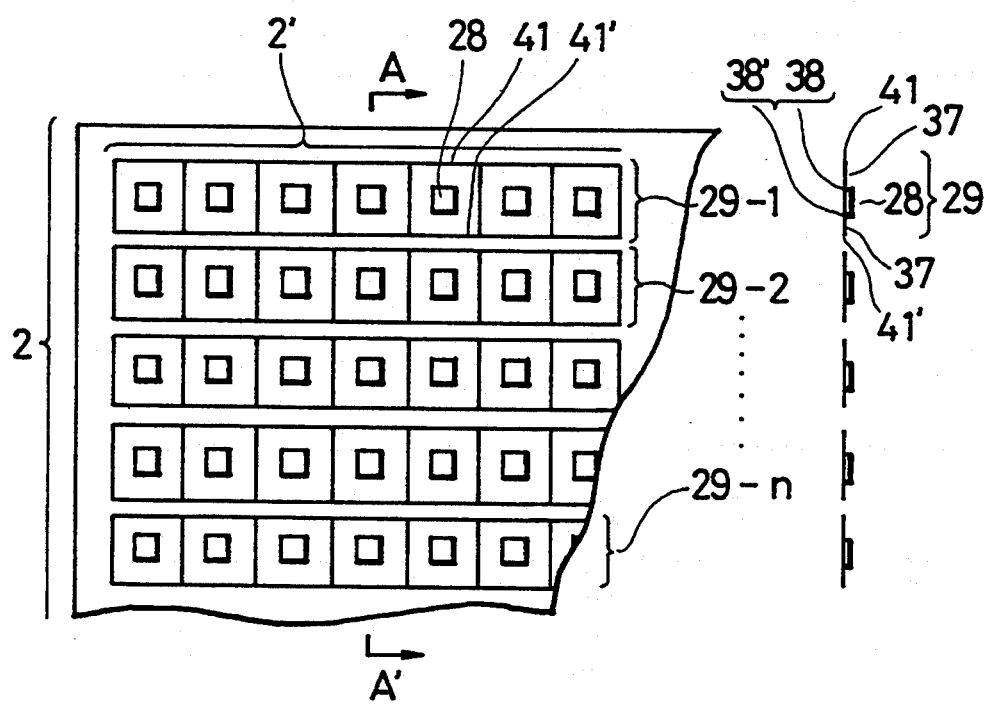
FIG. 4(A) and FIG. 4(B) are enlarged views of the substrate illustrated in FIG. 3.

In accordance with the connecting process described above, on one lead frame was mounted at least one electronic part chip 28, e.g. seven electronic part chips. A plurality of such lead frames 29-1, 29-2, . . . , 29-n was placed on a substrate 2, and a plurality of such substrates was placed in a holder 40 inside a chamber. The inside of the holder 40 was sized 60 cm×60 cm and the distance between a pair of electrodes was 30 cm (20 cm area in the distance 30 cm is effective to deposit fine layers). FIG. 4(A) is an enlarged view of one part of such substrate 2. The electronic part chips 28 are illustrated as squares in FIG. 4(A). Auxiliary bars 41 and 41', illustrated as straight lines in FIG. 4(A), are used to fix the leads of the lead frame temporally. FIG. 4(B) shows a longitudinal section at A—A' line in FIG. 4(A). Each of the electronic parts 29-1, 29-2, . . . , 29-n, i.e. 29, in FIG. 4(B) comprises the auxiliary bars 41 and 41', the leads 37, the pads 38 and 38', and the electronic part chip 28.

And by means of the plasma reaction apparatus shown in FIG. 3, a protective layer 27 made of silicon nitride was deposited on the electronic parts.

The plasma reaction apparatus comprises a reaction system 6 and a doping system 5 as shown in FIG. 3.

The reaction system 6 comprises a reaction chamber 1 having a reaction space, a preliminary chamber 7, and gate valves 8 and 9. The reaction chamber 1 comprises a supplying side hood 13 inside. The protective layers were deposited on the substrates by dispersing a reactive gas in the chamber through the hood 13 from an entrance side nozzle 3 followed by carrying out a plasma reaction. The gas to be exhausted reaches a valve 21 and then a vacuum pump 20 through an exhaust side hood 13' and an outlet port 4. An electric energy from a high frequency power source 10 is supplied between a pair of mesh electrodes 11 and 11' of the same size through a matching transformer 26 at a frequency of 50KHz–50MHz, e.g. 13.56MHz. Further, the middle point 25' of the matching transformer was grounded by the use of a ground level 25, and between this level and the substrate 2 was applied a DC or an AC bias with a frequency of 1 to 500KHz, e.g. 50KHz, by a bias supplying source 24. A reactive gas was kept not to reach the inside walls of the reaction chamber. A conductor was used as the holder 40 having a frame structure. In this case, the conductor was floating. Alternatively, an insulator can be used as the holder 40. The reactive gas was excited by the electric energy (the high frequency energy with a frequency of 50KHz to 50MHz) supplied between the pair of electrodes 11 and 11', and the DC or the AC bias (low frequency energy) was applied to the electric part chips from the bias supplying source 24, in order that the electronic part chips, the connecting parts, the stems bonded to the chips, or the lead frames should be coated with the protective film. In a plasma CVD process, the substrate surface, on which the protective layer is formed, is positioned parallel to the electric field direction between the pair of electrodes 11 and 11' in the holder 40 having the frame structure provided on a supporter 40' and the substrate is separated from the both electrodes. A plurality of the substrates is positioned at regular intervals (3–13 cm, e.g. 8 cm) or approximately regular intervals. Numbers of the substrates 2 are provided in a positive column in plasma generated by a glow discharge.

In FIG. 3, a nitride gas, e.g. nitrogen was dispersed in the reaction chamber through the nozzle 3 from 14 and a silicide gas, e.g. disilane ($Si_2H_6$) was from 17. At the moment, the fluxes of these gases were regulated by a flow meter 18 and a valve 19 and the ratio of $Si_2H_6$ to $N_2$ was kept in $\frac{1}{3}$ and the pressure inside the reaction chamber was from 0.01 to 0.1 torr, e.g. 0.05 torr. A high frequency energy having a frequency of 13.56MHz and an output of 1KW was supplied between the pair of electrodes 11 and 11'. Further, an AC bias having a frequency of 50KHz and an output of 100–500W was applied to the substrate 2 by bias means 12 and 24. Thus the substrates were heated by plasma, and silicon nitride layers 27 were deposited on the substrates to a thickness of 1000Å (1000Å±200Å) in average for ten minutes, without heating the substrate by any other heating means.

In the plasma reaction apparatus in FIG. 3, an etching gas for etching an interior of the reaction chamber or the like, e.g. nitrogen fluoride, can be supplied from 16.

The silicon nitride layer had a dielectric strength of more than $3 \times 10^6$V/cm and a resistivity of $2 \times 10^{15} \Omega cm$. In infrared absorption spectroscopy, an absorption peak of 864 cm$^{-1}$ corresponding to Si—N bond was observed, and the refractive index was from 1.7 to 1.8.

Further in this embodiment, an epoxy resin 33 was formed by the transfer mold method. Accordingly, the leads and the electronic part chip were united in a body.

Furthermore, tie bars (which are means to connect the leads temporally, that is, to keep an original distance between the leads temporally) and the auxiliary bars were removed. And the lead portions outside the epoxy resin 33 were bent in a prescribed form as shown in FIG. 1(C) followed by subjecting the lead surfaces to an acid cleaning, then the leads were solder-plated.

As shown in FIG. 1(C), in the electronic device of this embodiment the silicon nitride layer 27 is provided so that the electronic part chip 28, the stems 35, and the connecting parts 42 do not touch the epoxy resin 33. Therefore, even if moisture penetrates the organic resin mold material, the moisture is blocked by the silicon nitride layer not to reach the surface of the chip, the stems, and the connecting parts. Further, the silicon nitride layer prevents the moisture from penetrating the inside through the lead frame surface. So the electronic device in this embodiment has a high reliability.

In this embodiment, although the metallic leads, the electronic part chip, and the connecting parts were made of different materials respectively, these were packaged by the organic resin with a good adhesivity. This was actualized by coating the leads, the chip, and the connecting parts with the protective layer having a good adhesivity to them and providing on the protective layer the organic resin having the good adhesivity to the protective layer.

As shown in FIG. 1, a die and wires for bonding are not mounted in the electronic device in this embodiment. It is so miniaturized.

The electronic device in this embodiment was more miniaturized than conventional electronic devices, and additionally the drawback of the conventional electronic devices was solved that, after the conventional wire-bonding, the aluminum pad portion which surrounded the bonding wire touched the epoxy resin mold formed after the conventional wire-bonding and this caused corrosion of the aluminum pad.

Since the electronic device in this embodiment comprises the protective layer 27, even if the organic resin SS happens to have cracks or the like, the protective layer having a blocking effect can prevent the moisture from touching the electronic part chip or the like. The silicon nitride protective layer 27 has a high blocking effect to moisture and chlorine. The electronic device comprising the silicon nitride protective layer 27 underwent PCT (pressure cooker test) at 10 atm, for 100 hours, and at a temperature of 150 degrees Centigrade, and the result was obtained that few defects were observed. Although the conventional IC chips had a fraction defective from 50 to 100 fit, the fraction defective of the electronic device in this embodiment could be reduced to 5–10 fit (1 fit means $10^{-8}$, that is 0.000001%). Thus the electronic device comprising the silicon nitride protective layer 27 could resist a high temperature.

Besides, in this embodiment the drawback of the conventional electronic devices was solved that abrasion between dice on the rear side of the electronic part chips and the organic resins was easily caused by the heat generated when soldering the leads to PCB (printed circuit board), because of the difference between the coefficients of thermal expansion of the dice and the organic resins. Further, another drawback of the conventional electronic devices was solved that the moisture in the organic resin was rapidly vaporized by the heat generated when soldering and hereupon cracks were generated in the organic resin mold.

(Embodiment No.3)

This embodiment shows an example of manufacturing an electronic device in FIG. 1(A) and FIG. 1(C) making use of the plasma reaction apparatus in FIG. 3. FIG. 1(C) is an enlarged view of one part in FIG. 1(A).

In this embodiment, as a protective layer 27 is deposited a silicon nitride layer followed by being laminated by a diamond like carbon (simply referred to as DLC hereinafter) layer.

After connecting a pad 38 to a pad 38' by the use of solder 39 in the same way as Embodiment No.2, the silicon nitride layer was deposited in the same way as Embodiment No.2. In the case of depositing the DLC layer, instead of disilane and nitrogen, ethylene having a concentration of 100% was introduced into a reaction chamber 1 from 15. The pressure in the reaction space was kept at 0.01–0.5 torr, e.g. 0.05 torr. A high frequency energy and an AC bias were regulated in the same way as in Embodiment No.2. At the moment, substrates were heated by plasma, and the DLC layers were deposited on the silicon nitride layers to a thickness of 300–3000Å, e.g. 1000Å, at a film formation rate of 2Å per second, without heating the substrates by any other heating means.

Generally, a DLC layer does not adhere to metal and oxide, but in this embodiment first of all on the chip, the stems, and the connecting parts was deposited the silicon nitride layer with a good adhesivity to them, and then thereon was deposited the DLC layer with a good adhesivity to the silicon nitride layer. The silicon nitride layer was deposited to a thickness of 200–2000Å and the DLC layer to a thickness of 300–3000Å. The DLC layer had acid resistance to all kinds of acid, and the electronic device of this embodiment comprising the DLC protective layer also could resist a high temperature as the electronic device of Embodiment No.2 comprising the silicon nitride layer could.

In the electronic device in FIG. 1, since the chip is not wire-bonded, the die under the electronic part chip and the wires for bonding are omitted, so that the electronic device is miniaturized.

As the method of the present invention, a photo CVD or a photo PCVD (photo plasma chemical vapor deposition) can be employed, which makes use of not only an electric energy but also a light energy of far infrared rays having a wavelength of 10–15 μ or ultraviolet rays having a wavelength not more than 300 nm, for example.

In the above embodiments, the silicon nitride layer only and the multi-layer consisting of the silicon nitride layer and the DLC layer were used as the protective layer. However, a silicon oxinitride layer, a silicon carbide layer, or a multi-layer consisting of some of these layers and a DLC layer can be used instead. Besides, it is possible to use as the protective layer a monolayer made of DLC, silicon oxide, or other insulators, or a multi-layer consisting of some of these layers. The thickness of the protective layer was from 300 to 5000Å.

The organic resin can be also formed by an injection mold method.

The electronic device of the present invention may be an electronic device of flat package type, mini mold type, and chip carrier type.

Further, instead of bending the leads as shown in FIG. 1, the leads can be bent in a form illustrated in FIG. 2. When the electronic device in FIG. 2 is mounted on a PCB (printed circuit board), the electronic device surface to be connected to the PCB is opposite to the surface of the electronic device shown in FIG. 1 to be connected to the PCB. Therefore, even though the temperature rises rapidly while soldering the leads of the electronic device of FIG. 2 to the PCB at a temperature of 260 degrees Centigrade for 10 seconds, the cracks caused by a moisture expansion in the organic resin can be prevented from being generated in the package.

In the above embodiments is described an electronic device having eighty terminals and the form shown in FIG. 1 and FIG. 2, however, the electronic device of the present invention may have any number of terminals and any forms.

In Embodiments No.2 and No.3, the silicon nitride layer, the multi-layer comprising the silicon nitride layer and the DLC layer, or the like was deposited as the protective layer after connecting the lead frames to the electronic part chips. Additionally, such a protective layer 27 was formed to a uniform thickness and the electronic part chips 28, the connecting parts 42, and the lead frames 35 and 37 did not touch the organic resins 33 at all since the protective layers 27 were interposed therebetween. An AC bias can be applied equally to the whole lead frame during the film formation because the lead frame is conducting. Accordingly, an extremely dense layer can be deposited uniformly thereon. Further, an activation rate of the reactive gas could be improved because of the use of a high frequency energy.

Furthermore, the electronic part chip of the present invention may be not only a semiconductor integrated circuit but also a resistance and a capacitor.

The above description discloses the case of mounting an electronic part chip on a lead frame, however, the present invention is not limited particularly to a lead frame, but other matters having the same function as a lead frame may be used.

Since other modification and changes (varied to fit particular operating requirements and environments) will be apparent to those skilled in the art, the invention is not considered limited to the examples chosen for purposes of disclosure, and covers all changes and modifications which do not constitute departures from the true spirit and scope of this invention.

What is claimed is:

1. An electronic device comprising:
   a semiconductor chip having at least one pad provided thereon;
   at least one lead having a pad provided on a stem portion thereof, said stem portion extending over a corresponding pad of said at least one pad provided on the semiconductor chip;
   an organic resin covering at least said semiconductor chip and said stem portion of the lead; and
   a protective insulating film underlying said organic resin and covering said semiconductor chip, said at least one lead and a surface of said pad and said corresponding pad;
   wherein said pad is provided on said stem portion of the lead by a separate pad element being connected thereto and wherein said pad is directly connected to the corresponding pad provided on said semiconductor chip by a conductive layer.

2. An electronic device comprising:
   a semiconductor chip having at least one connecting portion;

at least one lead having a stem portion extending over said at least one connecting portion of the semiconductor chip;

pad means comprising a connecting part disposed between said at least one lead and said semiconductor chip, said connecting part having a first pad provided on said at least one lead, a second pad provided on said at least one connecting portion of said chip and a conductive layer directly connected between said first and second pads; and a protective layer covering at least said semiconductor chip, said stem portion of the lead and exposed surfaces of said connecting part.

3. The electronic device of claim 2 wherein said protective layer is made of silicon nitride.

4. The electronic device of claim 2 wherein said protective layer is a multi-layer comprising a silicon nitride layer and a diamond like carbon layer.

5. The electronic device of claims 1 or 2 wherein the pad provided on the stem portion of the lead and the pad provided on the semiconductor chip are made of different materials from each other and from said lead.

6. The electronic device of claims 1 or 2 wherein said semiconductor chip is not mounted on a die or base plate.

7. An electronic device comprising:

a semiconductor chip having at least one contact portion;

at least one lead connected to said at least one contact portion of said chip through pad means which contacts both said one connection portion and said at least one lead;

packaging means entirely enclosing said semiconductor chip except for said at least one connecting portion at which said pad means is provided and without the provision of a supporting die or base plate;

a protective layer underlying said packaging means and covering said semiconductor chip, said lead and said pad means; and wherein said pad means comprises a connecting part disposed between said at least one lead and said semiconductor chip, said connecting part having a first pad provided on said at least one lead, a second pad provided on said at least one connecting portion of said chip and a conductive layer between said first and second pads.

8. The device of claim 7, wherein said packaging means comprises an organic resin.

9. The electronic device of claim 7, wherein said pad provided on the at least one lead is a multi-layer comprising aluminum and gold; wherein said pad provided on said semiconductor chip is a nickel plated pad; and wherein said conductive layer comprises solder.

10. The electronic device of claim 1, wherein said protective insulating film comprises silicon nitride.

11. The electronic device of claim 1, wherein said protective insulating film is a multi-layer comprising silicon nitride and diamond-like carbon.

12. The electronic device of claim 1, wherein said pad provided on the lead is a multi-layer comprising aluminum and gold.

13. The electronic device of claim 1, wherein said pad provided on said semiconductor chip is a nickel plated pad.

14. The electronic device of claim 1, wherein said conductive layer comprises solder.

* * * * *